US008179149B1

(12) United States Patent
Holly

(10) Patent No.: US 8,179,149 B1
(45) Date of Patent: May 15, 2012

(54) ELECTROMAGNETIC FENCE

(75) Inventor: Sandor Holly, Woodland Hills, CA (US)

(73) Assignee: Sandor Holly, Woodland Hills, CA (US)

( * ) Notice: Subject to any disclaimer, the term of this patent is extended or adjusted under 35 U.S.C. 154(b) by 0 days.

(21) Appl. No.: 13/106,107

(22) Filed: May 12, 2011

(51) Int. Cl.
*G01R 27/04* (2006.01)
*G01R 27/32* (2006.01)

(52) U.S. Cl. ........................................ 324/629

(58) Field of Classification Search .................... None
See application file for complete search history.

(56) References Cited

U.S. PATENT DOCUMENTS

| | | | | |
|---|---|---|---|---|
| 3,707,709 | A * | 12/1972 | Wolf et al. | 340/552 |
| 4,450,434 | A * | 5/1984 | Nielsen et al. | 340/506 |
| 6,449,400 | B1 * | 9/2002 | Watanabe et al. | 385/12 |
| 6,480,728 | B1 * | 11/2002 | Mansour | 505/210 |
| 7,576,648 | B2 * | 8/2009 | Harman | 340/552 |
| 2004/0257218 | A1 * | 12/2004 | Shibata et al. | 340/522 |
| 2006/0083458 | A1 * | 4/2006 | Iffergan | 340/555 |

* cited by examiner

*Primary Examiner* — Jermele M Hollington
(74) *Attorney, Agent, or Firm* — Haynes and Boone, LLP

(57) ABSTRACT

A system and method can use a transmission line to remotely detect border violations. For example, the transmission line can be configured to use time domain reflectometry to determine when a person and/or object crosses a border. The border can be the border of a country or the perimeter of a facility such as an airport, for example.

25 Claims, 9 Drawing Sheets

ELECTROMAGNETIC FENCE

TECHNICAL FIELD

The present invention relates generally to electronic surveillance systems. The present invention relates more particularly, for example, to methods and systems for detecting in real time that a person and/or an object has crossed a boundary and for determining an accurate location of the crossing along the boundary.

BACKGROUND

Electronic surveillance systems for monitoring boundaries are well known. For example, a system of closed circuit cameras may be used to monitor a portion of the border of a country to help detect and deter the illegal entry of people into the country.

Although such contemporary surveillance systems have proven generally suitable for their intended purposes, they possess inherent deficiencies which detract from their overall effectiveness and desirability. For example, camera systems are difficult to implement and monitor for borders having a substantial length. A long border requires that many cameras be installed and monitored simultaneously. Often, budgetary constrains limit the number of cameras that may be installed and monitored. The implementation of such contemporary surveillance systems over extended distances is expensive to establish, operate, and maintain.

Further, surveillance systems that have a large number of cameras tend to be less reliable than desired. Not only may a human operator fail to notice suspicious activity, but often some percentage of the cameras will be inoperable. Such inoperable cameras can provide an opportunity for intruders to compromise the surveillance system. The utility afforded by such contemporary surveillance systems may also depend upon environmental factors, such as weather. An intrusion may be undetectable in adverse weather conditions, such as heavy wind, rain, fog, snow, and hail. Individual cameras can also be compromised in a specific area, such as by the intruders themselves.

As such, it is desirable to provide a surveillance system that is inexpensive to install and operate and that also reliably detects intrusions and their locations along a border, even in adverse conditions.

BRIEF SUMMARY

In accordance with embodiments further described herein, methods and systems are provided that can be advantageously used to facilitate border surveillance, for example. One or more embodiments can use time domain reflectometry to remotely detect and/or locate border violations. According to an embodiment, an electromagnetic fence system uses a transmission line (T.L.) comprising two or more parallel conductors having a characteristic impedance that is substantially constant along the full length of the transmission line. This transmission line can be installed along the border (boundary) to be surveyed and protected. A transmitter at one end of the transmission line can be installed and can be configured to produce a continuous stream of high voltage pulses with fast rise-times and to transmit the pulses along the transmission line. A receiver (which can be located on the same end of the transmission line as the transmitter) can be configured to receive any reflections of the transmitter generated pulses that are reflected back due to perturbations along the transmission line. A signal analyzer can be configured to determine a roundtrip distance between the transmitter and receiver to and from the perturbations of the transmission line's characteristic impedance value along the transmission line that cause the reflected signals.

According to an embodiment, the receiver can be connected to the transmission line via a directional coupler or by other means that protect the receiver front end from the high voltage outgoing pulses generated by the adjacent transmitter. A high speed switch may be employed in addition to, or in place of, the directional coupler that keeps the receiver disconnected from the transmission line during the time period (such as a few nanoseconds) while the high voltage pulse is transmitted and until the potential on the transmission line at the receiver's connection point to the transmission line returns to substantially zero.

According to an embodiment, a device can comprise two or more parallel conductors. The device can comprise a fence, a first conductor extending substantially along the fence line, and at least a second conductor extending substantially parallel to the first conductor. The first conductor can cooperate with the second (and perhaps additional) parallel conductors to define a transmission line, as mentioned above. A load connected to a far end of the transmission line can be configured to provide a substantially predetermined reflected electrical signal. This predetermined signal can provide a signature of reflected signal, thus characterizing nonuniformities of the transmission line. Each such complete reflected signature is created by each outgoing pulse from the transmitter.

According to an embodiment, an electromagnetic fence can comprise one or more shorter transmission line segments. Depending on losses and other characteristics of the transmission line used, a typical transmission line segment (which can have a dedicated control system, e.g., transmitter/receiver, signal analyzer, etc.) may have any length between a few hundred yards (or less) to 10 miles (or longer). A function of the signal analyzer can be to digitize and store the transmission line's characteristic signature as a base-line signature. This characteristic signature of the transmission line is substantially constant, as long as there is no intrusion or other disturbance anywhere along the transmission line. Data processing of an incoming data stream from the receiver (for example several thousand signatures per second) can include subtracting the characteristic signature or base-line in real time from each incoming signature, averaging these difference-signatures, and storing the results. A predetermined level of deviation from the averaged difference-signature value (which may be different for different transmission line segments) can indicate an intrusion and can set off an alarm or provide a signal that is indicative of the intrusion.

According to an embodiment, the transmission line can also be used as a high speed rail line that can transport a pod or the like with on-board capabilities such as a visible and/or IR camera with zoom, pan and tilt control, a visible and/or infrared spot light with pan and tilt control, a microphone, a loudspeaker, a paint-gun, one or more weapons such as a TASER® (a federally registered trademark of TASER International, Inc. of Scottsdale, Ariz.), a dart gun, and/or alarm hardware (high volume audio, siren, flashing light, etc.). Magnetic levitation or air-bearings may be used instead of conventional ball-bearings. The pod can respond to intrusions and threats quickly. A one minute response time at a distance three miles can generally be realized.

These and other features and advantages of the present invention will be more readily apparent from the detailed description of the embodiments set forth below taken in conjunction with the accompanying drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
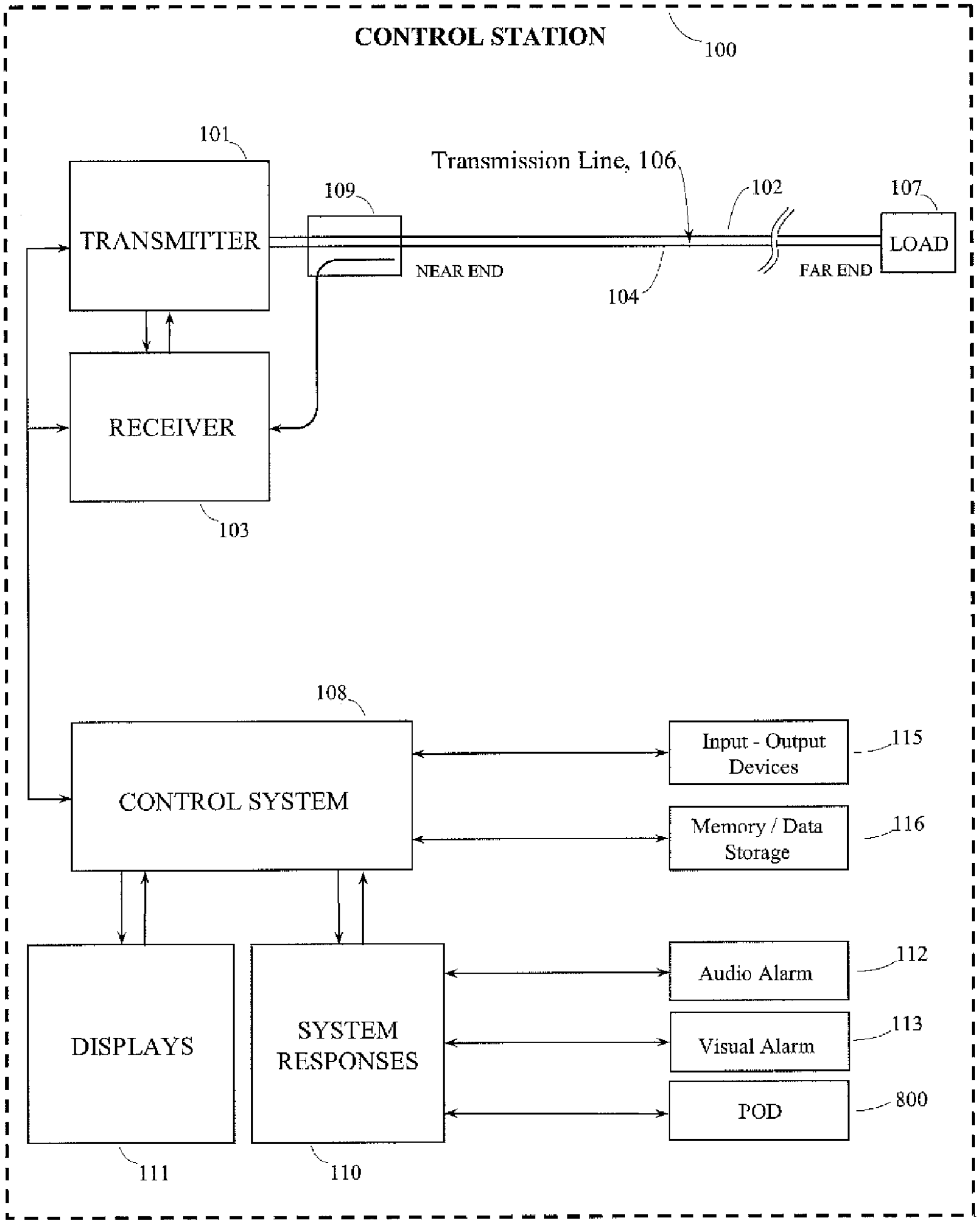
FIG. 1 is a block diagram of an electromagnetic fence system, according to an example of an embodiment.

The electromagnetic (EM) fence method and system disclosed herein can be based upon time domain reflectometry (TDR). The system can be used to monitor, detect, and locate, all in real time, points along boundaries, e.g., well defined boundaries, where an intrusion has occurred. A boundary can be the perimeter of a specific area, or it can be a continuous or non-continuous line separating two adjacent properties or two neighboring countries.

According to an embodiment, a transmission line can comprise two or more electrical conductors that are typically configured to run substantially parallel to the defined boundary and to each other. Characteristic impedances of the transmission lines formed between any two of these conductors can be made substantially constant along the length of the boundary. Miles of lengths of such a transmission line can be built in a generally continuous fashion.

According to an embodiment, the system can include a transmitter having an output of a generally continuous stream of short pulses, a receiver that is designed to receive pulses that are reflected back from transmission line discontinuities and other disturbances that develop along the line, and a control system that analyzes, processes, interprets, and displays the received data. The control system can be configured to determine a distance to and attributes of a perturbation along the transmission line that cause reflected pulses to appear due to intrusions.

According to an embodiment, transmission line lengths can be substantially extended by reducing line losses, using selected materials (such as high temperature superconducting materials for the transmission line and low loss dielectric materials having a low dielectric constant for support structures). The undesirable effects of line dispersion can be mitigated by using nonlinear methods (resulting in Soliton-like pulse propagation along the transmission line, for example).

According to an embodiment, the electromagnetic fence may have any length. The electromagnetic fence can be assembled of an arbitrary number of transmission line segments, wherein each transmission line segment has a dedicated control station.

According to an embodiment, a capsule or instrument pod can travel along the transmission line (such as by using the transmission line conductors as rails, or such as by having separate rails or other guiding hardware) at high speeds. In this manner, the pod can reach the point of intrusion and can be used as response (such as to challenge to the detected threat).

According to an embodiment, an electromagnetic fence system can have a first conductor configured to define a boundary and a second conductor extending proximate the first conductor. The first conductor can cooperate with the second conductor to define a transmission line having a substantially constant characteristic impedance. A transmitter can be configured to provide a first electrical signal and to transmit the first electrical signal along the transmission line. A receiver can be configured to receive at least one second electrical signal that is reflected along the transmission line. An analyzer can be configured to determine a distance to and attributes of a perturbation along the transmission line that causes the reflected second electrical signal.

FIG. 1 is a block diagram of an electromagnetic fence system 100, according to an example of an embodiment. The electromagnetic fence system 100 can comprise a transmitter 101 that is configured to transmit a transmitted signal to a first conductor 102. A receiver 103 can be configured to receive the transmitted signal and a reflected or received signal from a second conductor 104. The first conductor 102 and the second conductor 104 can be substantially parallel with respect to one another and can define a transmission line 106.

The transmitter 101 can be a pulsed high voltage power supply or pulse generator. Thus, when the pulse is on, typically for a very short time period (nanoseconds), then thousands of volts can be applied to the transmission line 106 and hundreds of amperes can be flowing through the transmission line 106 during that short period. Both the transmitter 101 and the receiver 103 can be connected to both the first conductor 102 and the second conduct 104 such that the potential difference can be applied by the transmitter 101 between both the first conductor 102 and the second conductor 104 and can be sensed by the receiver 103 between the first conductor 102 and the second conductor 104.

Figure 5:
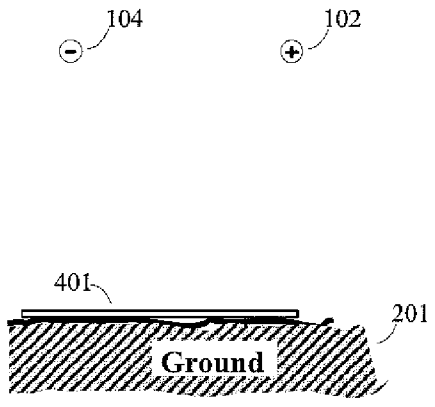
FIG. 5 is an end view of a three-conductor transmission line having a combination of a generally horizontal configuration and a generally vertical configuration wherein one of the conductors is a metal plate or screen (ground plane), and wherein two conductors are in a plane substantially parallel to and above a conducting ground plane on the ground, according to an example of an embodiment.
Figure 6:
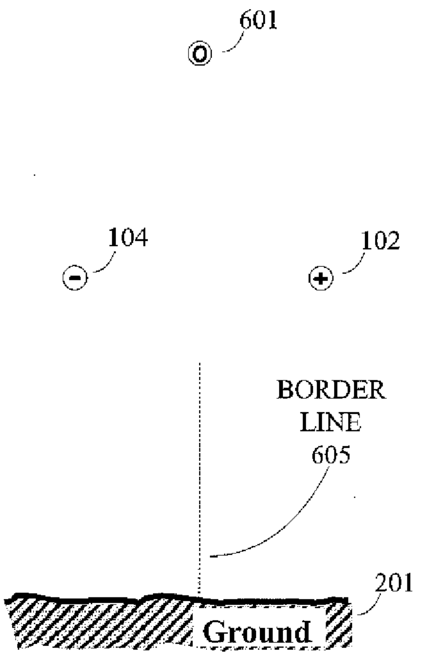
FIG. 6 is an end view of a three-conductor transmission line, wherein the three conductors have a generally triangular configuration, according to an example of an embodiment.
Figure 7:
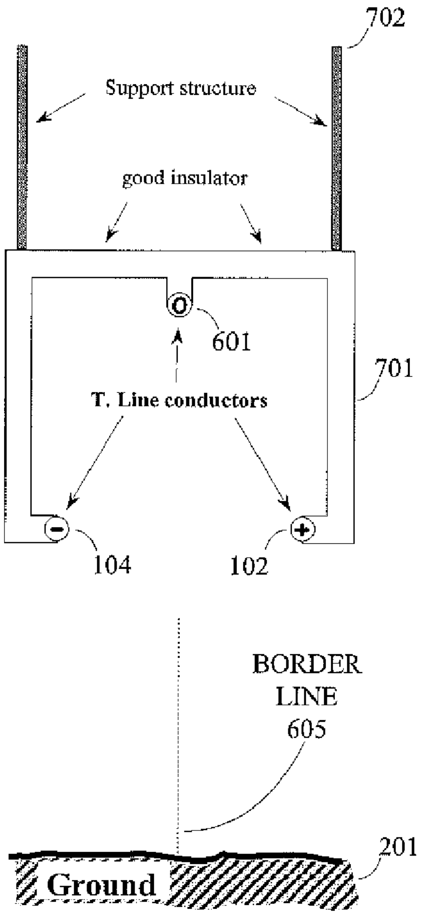
FIG. 7 is an end view of a three-conductor transmission line periodically supported by insulating frames which are supported from above by a support structure, according to an example of an embodiment.

In the case of a three-conductor transmission line (such as shown in FIGS. 5, 6, and 7, for example) either two transmitters 101 and two receivers 103 or one transmitter 101 and one receiver 103 or a combination of both cases could be used. For example, when two transmitters 101 and two receivers 103 are used, then one of the transmitters 101 and one of the receivers 103 can be connected (referring to FIG. 5, for example) between the ground plane 401 and the conductor 102 and the other transmitter 101 and receiver 103 can be connected between the ground plane and the conductor 104.

As a further example, when one transmitter 101 and one receiver 103 are used (such as is shown in FIG. 1), then the transmitter 101 can be connected (referring to FIG. 5, for example) to the transmission line 106 formed between the ground plane 401 and one of the two conductors 102 or 104 above it. The receiver 103 can be connected to the separate, new transmission line formed between the ground plane and the other of the two conductors above the groundplane 401, as discussed in further detail below.

The electromagnetic fence system 100 can further comprise an analyzer or control system 108. The control system 108 can control operation of the electromagnetic fence system 100. For example, the transmitter 101 can produce a generally continuous stream of high voltage, short, fast rise-time, high repetition-rate pulses. The output of the transmitter 101 can be connected to the transmission line 106, which can be capable of high voltage operation, can have substantially constant characteristic impedance, can have low losses, and can tend to have minimum dispersion. A termination or load 107 at the far end of the transmission line 106 may be used to reflect a known percentage of the incident pulses that can be used in various ways as discussed herein.

The receiver 103 can be well shielded, located adjacent to the transmitter 101, can be very sensitive, and can be connected to the transmission line 106 via a directional coupler 109, or by other means. The directional coupler 109 or the like can provide isolation and protection of the receiver 103 from the high voltage transmitter pulses. Additional protection, such as high speed switches (not shown) can be used. Such high speed switches can be configured to disconnect and/or substantially short circuit the input to the receiver 103 during the short time periods when the output pulses from the transmitter 101 are emitted.

The receiver 103 can provide signal processing, amplifying, digitizing, averaging, and noise reduction. Arithmetic circuits of the receiver 103 can be used to substantially minimize system noise, for example.

The control system 108 can be responsible for overall system performance. A data stream from the receiver 103 can be generally continuously analyzed and evaluated. For example, the data stream can be evaluated and the data can be formatted for use by various subsystems, such as for alarm functions, local and remote displays, as well as response vehicle operations and controls.

Thus, typically generated by the transmitter 101 is a continuous stream of high voltage short duration pulses which are sent down the transmission line 106. Depending on the application, including the length of the transmission line 106 and attenuation due to ohmic and scattering losses, pulse heights can be in the one to several kilovolt range (several tens of kilovolts in extreme cases). Pulse widths, (again, depending on the application and environmental conditions) can typically be in a range of between one and several tens of nanoseconds. Pulse rise-times and fall-times can also be determined by the application and its spatial resolution requirements. As an example, a one nanosecond pulse rise time will support spatial resolution in the order of less than one foot with moderate, but practical line lengths and realistic line dispersion values.

The transmission line 106 can be disposed along a border. For example, the transmission line 106 can be disposed along the border of a country or around the perimeter of any desired area. The transmission line 106 can be along a boundary line or part of a very long fence, such as a home-defense related system to be installed between countries.

A perturbation along the transmission line 106 can cause part of the transmitted signal (e.g., pulses, produced by the transmitter) to be reflected (thus defining a received signal) traveling in the reverse direction along the transmission line 106. Such a reflection can result either by imperfection in transmission line characteristics, or when the electromagnetic field surrounding the transmission line 106 is perturbed. In this manner, time domain reflectometry can be used to remotely detect and/or locate border violations.

Part of the signal that is due to reflection as a result of existing transmission line imperfections can be subtracted/eliminated. The remaining reflection received by the receiver 103 can be used as an indication that the electromagnetic fence has been intruded upon, e.g., violated, approached or crossed. Thus, that part of the signal that is not caused by an intrusion can be substantially eliminated so as to better facilitate intrusion detection.

Such a perturbation can be caused by a person, a group of persons and/or an object approaching the transmission line 106. Such a perturbation can be caused by a person and/or an object passing adjacent to or through between the conductors of the transmission line 106.

The transmitter 101 and receiver 103 can be disposed at a near end of the transmission line 106. The load 107 can be electrically connected across the conductors at the far end of the transmission line 106. The load (also called transmission line termination) 107 can cause a reflection to be generated. This reflection can be recognized as originating at the load 107 since the load 107 has a known impedance and reflection coefficient, and is a known distance from the near end of the transmission line 106. This known distance is equal to the overall length of the transmission line, being interrogated by the transmitter/receiver pair. This signal resulting from reflection off the load 107 can be used for various purposes. Monitoring losses of the transmission line 106 on the continuous basis is one such purpose. The pulses received as reflections from the load 107 indicate the end of a line signature. Receipt of pulses reflected from the load 107 at the far end of the transmission line 106 indicates to the receiver 103 (such as to an analyzer of the control system 108), that the full length of the transmission line was swept out in roundtrip and the transmission line 106 is ready to accept a next pulse. Under typical operating conditions, the next pulse from the transmitter 101 will not start until the previously transmitted pulse, reflected off the load 107 is received. Estimation of magnitude of an intrusion anywhere along the transmission line is made by using characteristics of the signal reflected off the Load with known impedance.

The control system 108 can receive a signal representative of the reflected signal from the receiver 103. The signal representative of the reflected signal can be filtered, attenuated, amplified, digitized, or otherwise processed by a signal processor, part of the receiver prior to being received by the control system 108. The control system 108 can also receive a signal such as a trigger signal representative of the high voltage pulses emitted from the transmitter 101. The trigger signal can be filtered, attenuated, amplified, digitized, or otherwise processed prior to being received by the control system 108. In addition to the received pulse, coming as reflected signal from the load 107 at the far end of the transmission line 106, in the time period between a pulse emitted from the transmitter 101 and arrival of the pulse reflected from the load 107 at the far end of the transmission line 106, there is a signature of typically low level signals, received at the receiver 103. The signals can be created by non-uniformity of the characteristic impedance of the transmission line along its full length from the transmitter 101 to the load 107. The signals can be a characteristic signature of the particular segment of the transmission line 106 between its near and far ends. The signal can be representative of minute variations of the transmission line's impedance in terms of a time domain signal in a time window between $t_1$ (time when the pulse starts at the transmitter 101 at the near end of the transmission line 106) and $t_2$ (time when this same pulse is reflected by the load at the far end of the transmission line 106 and arrives back at the receiver 103).

Most often, the transmission line signature signal will be substantially constant, e.g., will keep repeating itself. Since it is substantially constant, the signal can be averaged over a few (or many) cycles to eliminate or minimize a noise component that can be time varying. Such a time-varying (noise) component can be created, for example, by wind, moving tree branches nearby, transmission line hardware vibrations, etc. The averaged signal or signature can be digitized, stored and used in various ways. For example, the signal can be subtracted from real time data, thus providing real-time data that is cleaned of effects of line characteristic impedance variations with time. This is one example of data processing that may be used within the control system 108 to enhance the all important part of detected signal caused by intrusion, trespassing through this electromagnetic fence.

The control system 108 can be configured to determine a distance to the location of an intrusion caused perturbation along the transmission line 106. The distance can be determined by using the known speed of propagation of the pulses emitted by the transmitter and the reflected pulses along the transmission line 106 and the time between sending the transmitted signal and receiving the part of the received signal reflected back at the location of perturbation. A sample of the signal representative of the transmitted signal from the transmitter 101 can be a trigger to facilitate the determination of this time.

The control system 108 can be configured to determine a size of the perturbation, and consequent a size of the person/group of persons and/or object (to determine whether the object is car or a truck, for example) causing the perturbation. The size of the perturbation can be determined by comparing the amplitude of the transmitted signal to the amplitude of part of the reflected signal signature due to the trespasser while considering other factors such as propagation losses. In the determination of the size of a perturbation, an all important role is played by a table of values assembled, digitized and stored during the calibration phase of a freshly installed transmission line segment. The signal representative of the transmitted signal from the transmitter 101 can be a baseline that is used to facilitate the determination of the location and size of the perturbation.

The control system 108 can be configured to compensate for a slowly changing impedance of the transmission line 106 when no intruder caused perturbation is present. Such slow changes in the impedance can be due, for example, to changes in environmental conditions, e.g., temperature and humidity. Small changes in transmission line shape and geometry due to thermal expansion of conductors is an example. Such slow changes in the impedance can be due, for example, to changes in nearby vegetation, e.g., tree growth. Characteristics of reflections caused by the load 107 can be monitored and slow changes in the amplitudes and arrival times coming from the known load thereof can be assumed to be due to such slow changes in the impedance of the transmission line 106. A baseline impedance value used by the control system 108 can be periodically updated to account for such changes.

The control system 108 can produce a difference signal by subtracting a stored baseline signal from each received electrical signal. The baseline signal segment length and the received signal segment length both depend on the physical length of the particular transmission line that is interrogated. Such processing by the control system 108 can be automatically performed either digitally or in analog.

The receiver 103 can have a dynamic gain control for adjusting signal amplification in a linear, saw tooth fashion or in a non-linear way. The dynamic gain control can be used to compensate for line losses and to improve the dynamic range of receiver sensitivity.

A display 111 can indicate where a perturbation has been detected along the transmission line 106. For example, a graphic representation of the fence, border, or transmission line 106 can have a visual marker or other indicator displayed at the location of a detected intrusion. The marker can be held on the display 111 for a predetermined period of time, (showing perhaps the elapsed time digitally) after which (or by manual control) the display screen of the display 111 can be refreshed.

The display 111 can use the difference signal in various ways. For example, a chosen number of difference signal segments (individual signal signatures) can be averaged. An intrusion can be shown as a difference signal increase at a particular point on the time domain, which corresponds to a physical location along the fence at a well defined distance from the transmitted/receiver, e.g., from the near end. The signal can be shown on the display 111 as a specific location on a map along the fence line. An intensity of the difference signal can be shown on the display 111 as a magnitude of the intrusion, e.g., the size of the intruding person, group of persons or object. Thus, a single person can readily be distinguished from a vehicle, for example.

A variety of system response 110 can be used. For example, an audio alarm 112 can sound to indicate that an intrusion has been detected. The audio alarm 112 can be a buzzer, bell, siren, or any other type of audio alarm. A choice of other alarm means, such as visual alarm 113 (e.g., a flashing light) may be implemented. A rapidly moving pod 800 equipped with a choice of response-tools may be activated. Various input and output devices 115 can be used to interact with the system 115. The input and output devices 115 can be conventional, off the shelf hardware, parts of any computer systems. (mouse, touchpad, printer, additional display screens, remote controls are examples). Memory/data storage can be used to store program instructions and data for used by the control system 108. External hard drives are examples of such memory and data storage 116.

Figure 2:
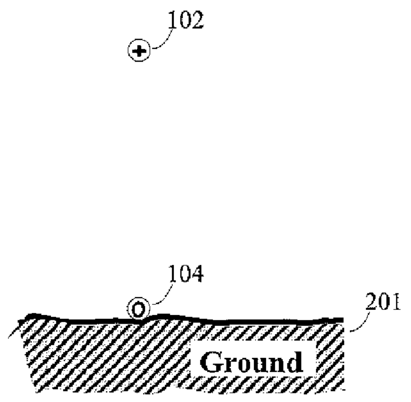
FIG. 2 is an end view of a two-conductor transmission line having a generally vertical configuration, wherein the two conductors are in a vertical plane or in a plane substantially perpendicular to the ground, according to an example of an embodiment.

FIG. 2 is an end view of a two-conductor transmission line 106 having a generally vertical configuration, according to an example of an embodiment. The first conductor 102 is positioned generally vertically above the second conductor 104. Depending on the application, the first conductor 102 can be positioned approximately 1.5 to 2.0 meters above the ground 201 and the second conductor can be proximate the ground, for example. Any desired separation distance between the two conductors can be used.

In various embodiments, the first conductor 102 and/or the second conductor 104 can be insulated from the ground 201. In various embodiments, either the first conductor 102 or the second conductor 104 can be uninsulated or in electrical contact with the ground 201. In specific applications the ground 201 can be the first conductor 102 or the second conductor 104. Because this configuration produces a substantially lossy transmission line it's use is for short transmission line runs only.

The first conductor 102 and the second conductor 104 can have either polarity with respect to one another. For example, first conductor 102 can be either positive or negative with respect to the second conductor 104, which can be at ground potential.

Figure 3:
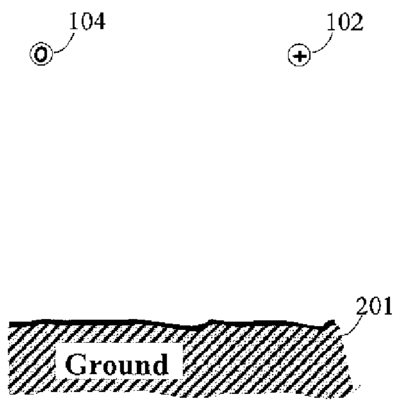
FIG. 3 is an end view of a two-conductor transmission line having a generally horizontal configuration, e.g., wherein the two conductors of the transmission line are in a horizontal plane, or on a plane that is parallel to ground, according to an example of an embodiment.

FIG. 3 is an end view of a two-conductor transmission line 106 having a generally horizontal configuration, according to an example of an embodiment. The first conductor 102 and the second conductor 104 are positioned approximately the same distance above the ground 201. The first conductor 102 and the second conductor 104 can be positioned approximately 1.5 to 2.0 meters apart from one another, for example. In each of the embodiments, the separation distances between the conductors and the ground can be optimized for a specific application.

Figure 4:
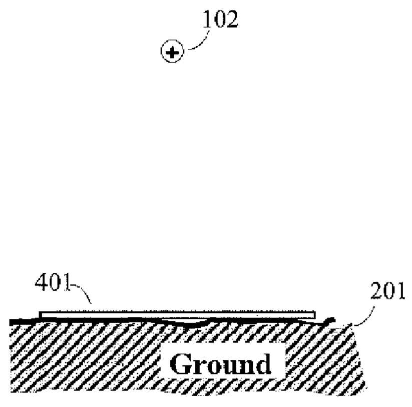
FIG. 4 is an end view of a two-conductor transmission line having a generally vertical configuration, e.g., wherein the two conductors of the transmission line are in a vertical plane or in a plane that is perpendicular to the ground and wherein one of the conductors is a metal plate or screen (e.g., a ground plane), according to an example of an embodiment.

FIG. 4 is an end view of a two-conductor transmission line 106 having a generally vertical configuration wherein one of the conductors is a electrically conducting ground plane 401, positioned on the surface of the ground, according to an example of an embodiment. The first conductor 102 and the ground plane 401 can be positioned approximately 1.5 to 2.0 meters apart from one another, for example. The ground plane 401 can be insulated from the ground 201 or can be in electrical contact with the ground 201. The ground plane can be an electrically conducting metal plate or a metal screen.

FIG. 5 is an end view of a three-conductor transmission line 106 having a combination of a generally horizontal configuration and a generally vertical configuration wherein one of the conductors is the ground plane 401, such as an electrically conductive metal plate or screen, according to an example of an embodiment. The first conductor 102, the second conductor 104, and the ground plane 401 can be positioned approximately 1.5 to 2.0 meters apart from one another, for example. The first conductor 102 and the second conductor 104 can be positioned approximately 1.5 to 2.0 meters above the ground plate, for example.

Any desired number of conductors can be used to define a multi-conductor transmission line 106. For example, the transmission line 106 can comprise 2, 3, 4, 5, 6, 7, 8 or more conductors. Any desired polarity combinations of conductors can be used, that serves the purpose of the specific application. For example, the first conductor 102 can have a positive polarity and the second conductor 104 can have a negative polarity, or vice-versa. Any desired configuration of conductors can be used. For example, the conductors can define a linear array or various other desired patterns or shapes. The configuration of the conductors can be custom designed to solve the needs of the specific application. As an example, the three conductor arrangement of FIG. 5 allows the system to remotely determine the direction and speed of a border-crossing intrusion.

One or more loads 107 can be used. For example, all of the positive polarity conductors of a transmission line and all of the negative polarity conductors of the same transmission line 106 can be in electrical contact with a single load 107. As another example, each pair of positive polarity and negative polarity conductors can be in electrical contact with a dedicated one of a plurality of different loads 107.

FIG. 6 is an end view of a three-conductor transmission line 106 having a generally triangular cross sectional configuration, according to an example of an embodiment. A third conductor 601 can be positioned above (or below) the first conductor 102 and the second conductor 104. The first conductor 102 and the second conductor 104 can be positioned approximately the same distance above the ground 201. The first conductor 102, the second conductor 104, and the third conductor 601 can be positioned approximately 1.5 to 2.0 meters apart from one another, for example. The first conductor 102 and the second conductor 104 can be positioned approximately 1.5 to 2.0 meters above the ground, for example. Requirements of the specific application determines the appropriate distances among the three conductors and the ground. The transmission line characteristic impedances are determined by these inter-conductor distances together with the conductors' diameters.

Any desired number of conductors in any desired configuration can be used. For example, three conductors can be configured as a triangle in cross-section. As a further example, four conductors can be configured as four parallel conductors all lying in the same horizontal (or vertical) plane (not shown). The cross-sectional shape or configuration can be substantially constant along the entire length of the transmission line 106 to ensure substantially constant transmission line characteristic impedances.

The transmission line 106 has a characteristic impedance ($Z_0$) that can be calculated or measured between any two conductors of the transmission line 106. The characteristic impedance of these lines can be changed by a person or object intruding upon the transmission line 106. The change in the characteristic impedance can result in a reflection of the transmitted signal, resulting in a reflected or received signal, being detected by the receiver at the near end of the transmission line 106.

The third conductor 601 can be at ground potential, while the first conductor 102 and the second conductor 104 can be at positive and negative potentials with respect to ground during the pulse durations.

The first conductor 102, the second conductor 104, and the third conductor 601 can be positioned above or proximate a border line 605. The use of additional conductors, e.g., the third conductor 601, can enhance the sensitivity of the electromagnetic fence, also allows determination of other information associated with fence intrusion, such as direction of fence crossing, the speed of transit, etc., as discussed herein. Thus, according to an embodiment, enhanced system redundancy is provided.

The use of additional conductors can focus the flux lines that surround the transmission line 106 such that the flux lines tend to extend further in a desired direction. For example, the flux lines can be more concentrated below the transmission line 106 than above the transmission line 106 via the use of additional conductors. The increased concentration of flux lines proximate the ground enhances the sensitivity of the electromagnetic fence proximate the ground, where the intruder is more likely to be during border crossing.

FIG. 7 is an end view of a three-conductor transmission line 106 that can be supported by a series of frames 701 that in turn can be supported by a support structure 702, according to an example of an embodiment. The frame 701 can be formed, at least partially, of an insulator so as to maintain desired electrical isolation of the first conductor 102, the second conductor 104, and the third conductor 601. For example, the frame 701 can be formed of a high quality dielectric insulator with low dielectric constant and low radio frequency loss. The frame 701 can be supported by the support structure 702, such as via the use of dedicated poles or via the use of a fence, as discussed herein.

Figure 8:
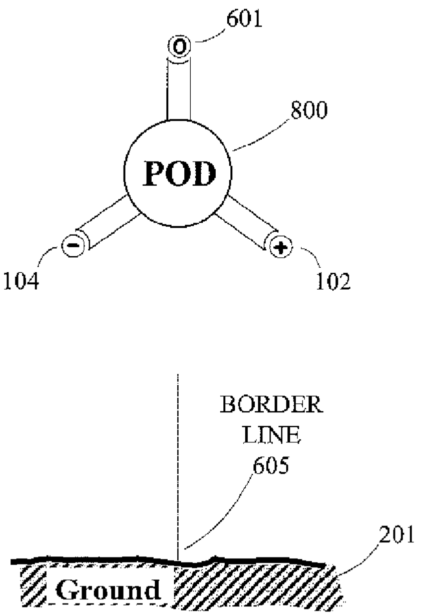
FIG. 8 is an end view of a three-conductor transmission line, also serving as rails for an instrument pod, according to an example of an embodiment.

FIG. 8 is an end view of a three-conductor transmission line 106 defining rails for an instrument pod 800 according to an example of an embodiment. The pod 800 can be configured to travel along the transmission line 106 and can be configured with operational capability to investigate the perturbation, respond and challenge an intrusion.

At least one of the first conductor 102 and the second conductor 104 can define a rail. The pod 800 can be configured to travel along one, two, three, or more rails. Some or all of the rails can also be conductors that are configured to transmit pulses of the electromagnetic fence, as discussed herein. Additional uses of these three rails include transmitting DC power to operate various functions of the pod, and used as a communications channel for pod control and information transfer.

Figure 9:
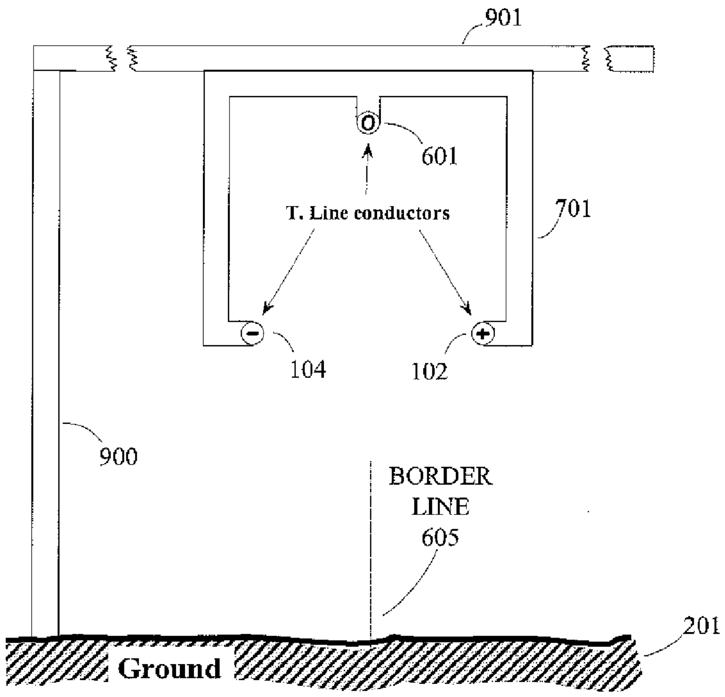
FIG. 9 is an end view of a three-conductor transmission line supported above the ground by insulating frames and support structures at periodic intervals along the transmission line, according to an example of an embodiment.

FIG. 9 is an end view of a three-conductor transmission line 106 supported above the ground by a frame 701 and a support structure 901, according to an example of an embodiment. The support structure 901 can be supported by dedicated poles 900 or any other desired structures. The support structure 901 can be supported by a fence or other barrier, for example. The pole 900 can be part of a fence or barrier, for example.

Figure 10:
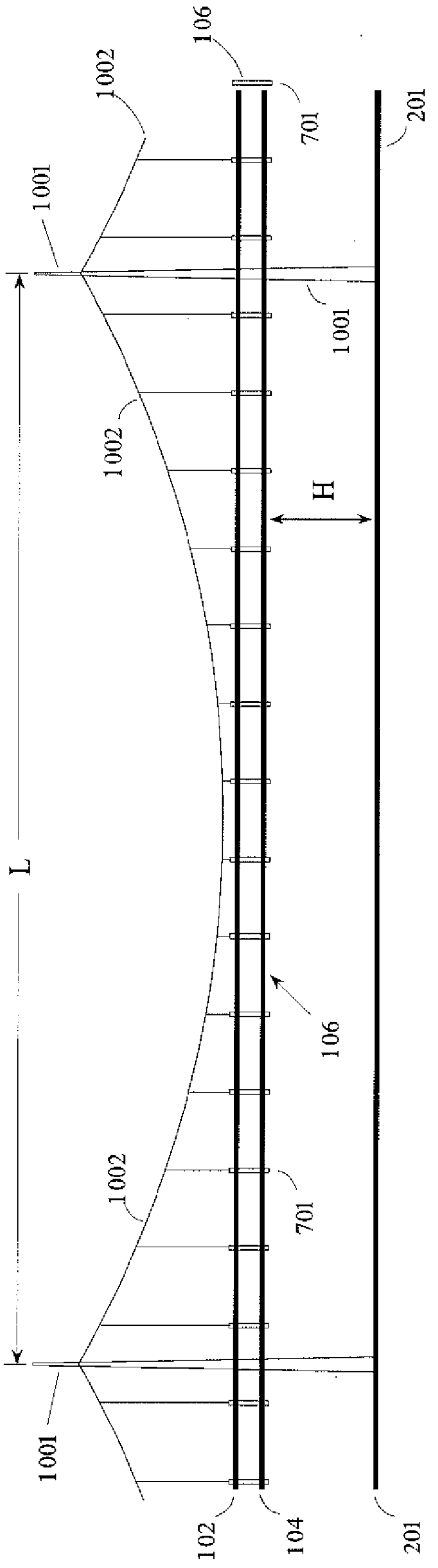
FIG. 10 is a side view of a transmission line supported by suspending it from above while maintaining the characteristic impedance of the transmission line at a substantially constant value, according to an example of an embodiment.

FIG. 10 is a side view of a transmission line 106 supported by suspending it from above, according to an example of an embodiment. Towers or poles 1001 can support a suspension cable system 1002, which in turn supports a plurality of frames 701. The frames 701, in turn, support the first conductor 102 and the second conductor 104. The frames 701 can support any desired number of conductors.

A distance, Dimension L, between adjacent poles 1001 can be approximately 20 to 100 meters, for example. A height, Dimension H, of the first conductor 102 and/or the second conductor 104 above the ground 201 can be approximately 1.5 to 2.0 meters, for example.

Figure 11:
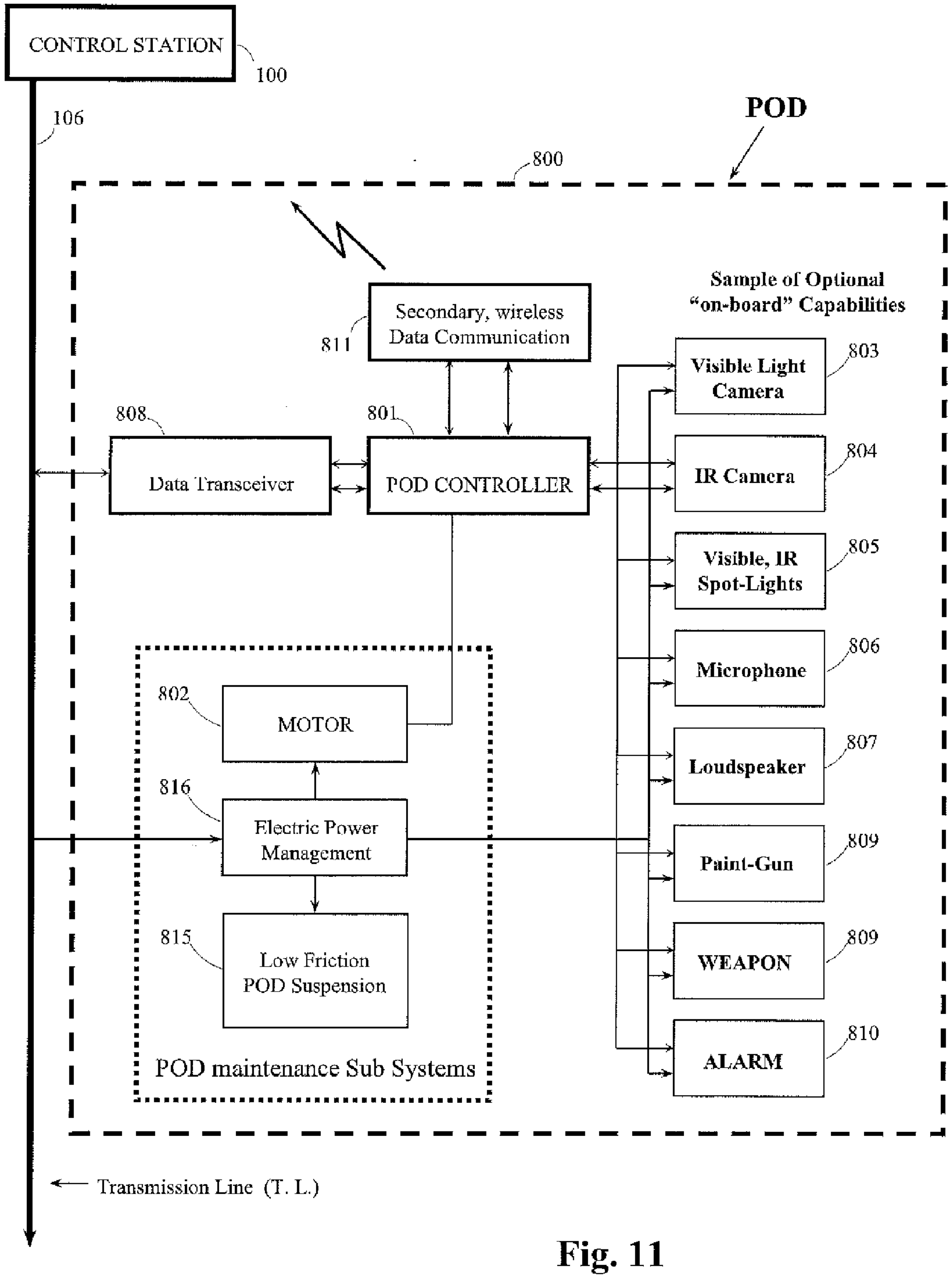
FIG. 11 is a block diagram of a pod, showing examples of on-board capabilities, according to an example of an embodiment.

FIG. 11 is a block diagram of a pod 800, according to an example of an embodiment. The pod 800 can have a visible light video camera 803, an infrared video camera 804, a spotlight 805, a microphone 806, a loudspeaker 807, a transceiver 808, and/or various weapons 809. The weapons 809 can be any lethal weapon and/or non-lethal weapon. For example, the weapon can be a TASER® (a federally registered trademark of TASER International, Inc. of Scottsdale, Ariz.).

A pod controller 801 can control a motor 802, as well as the visible light video camera 803, the infrared video camera 804, the spotlight 805, the microphone 806, the loudspeaker 807, the transceiver 808, and/or the weapon 809. The controller 801 can operate autonomously or can be under the control of a person, computer, or other device. For example, the controller 801 can receive instructions from a person via signals transmitted via the transmission line 106, via the transceiver 808. A secondary, wireless communication link 811 between the pod and the control station can be implemented via a cellular telephone system, via satellite, or via any other desired means. The pod 800 can be dispatched automatically in response to a detected intrusion. The pod 800 can have manual over-ride capability.

The motor 802 can move the pod 800 along the transmission line 106 and/or the rails defined thereby. The motor 802 can be a bi-directional electrical motor that is powered by batteries carried onboard the pod 800 or electric power to the pod can be drawn via the transmission line conductors. The motor 802 can be any other type of motor and can be powered in any desired manner.

As an alternative to or in addition to the pod 800, guards, soldiers, or other personnel can respond to a detected intrusion. The pod 800 can be used to determine if a human response is desired.

Instead of using conventional ball-bearings, air bearings or magnetic levitation can be used 815 to support the pod 800 on the rails or transmission line conductors, e.g. the first conductor 102, the second conductor 104, and/or the third conductor 601. Operation of the motor 802 and the pod suspension 815 can accomplished via electric power management 816. In an alternate arrangement, the pod rails can be a separate structure, (separate both mechanically and electrically) running parallel to the transmission line conductors in its close vicinity.

In those instances wherein the pod rail is separate from the transmission line, it can be necessary to synchronize the physical locations at substantially every point between the pod rail and the transmission line. Generally, the pod rail can run substantially parallel to the transmission line. FIGS. 14A-14D show four different such configurations as examples.

One or more pods 800 can be used on a single set of rails. A single pod can be shared among a plurality of sets of rails.

Transmission lines 106 can be nested or grouped, one substantially adjacent another, to define plural layers of protection by plural electromagnetic fences. The plural electromagnetic fences can have different sensitivities and can initiate different responses. The sensitivity and/or the response can escalate as each additional layer is intruded upon. For example, when an outer layer is intruded upon, a pod 800 can investigate and when an inner layer is intruded upon, armed guards or soldiers can investigate.

An alarm or warning system 810 (which can be part of the pod 800 and/or can be spaced along the transmission line 106) can alert potential intruders that the system is active and/or that high voltage is present. The warning system can comprise signs, audio annunciators, and/or lights. The signs can be in any desired language or languages. The audio annunciators can be any desired combination of bells, buzzers, sirens, voice recordings, or the like. The lights can be strobe lights or illuminated optical fibers. The optical fibers can be illuminated by strobe lights. A proximity sensor can activate the audio annunciator and/or the lights when an approaching intruder is sensed. The pod can be in substantially constant contact (communication) with its control station 100.

Figure 12:
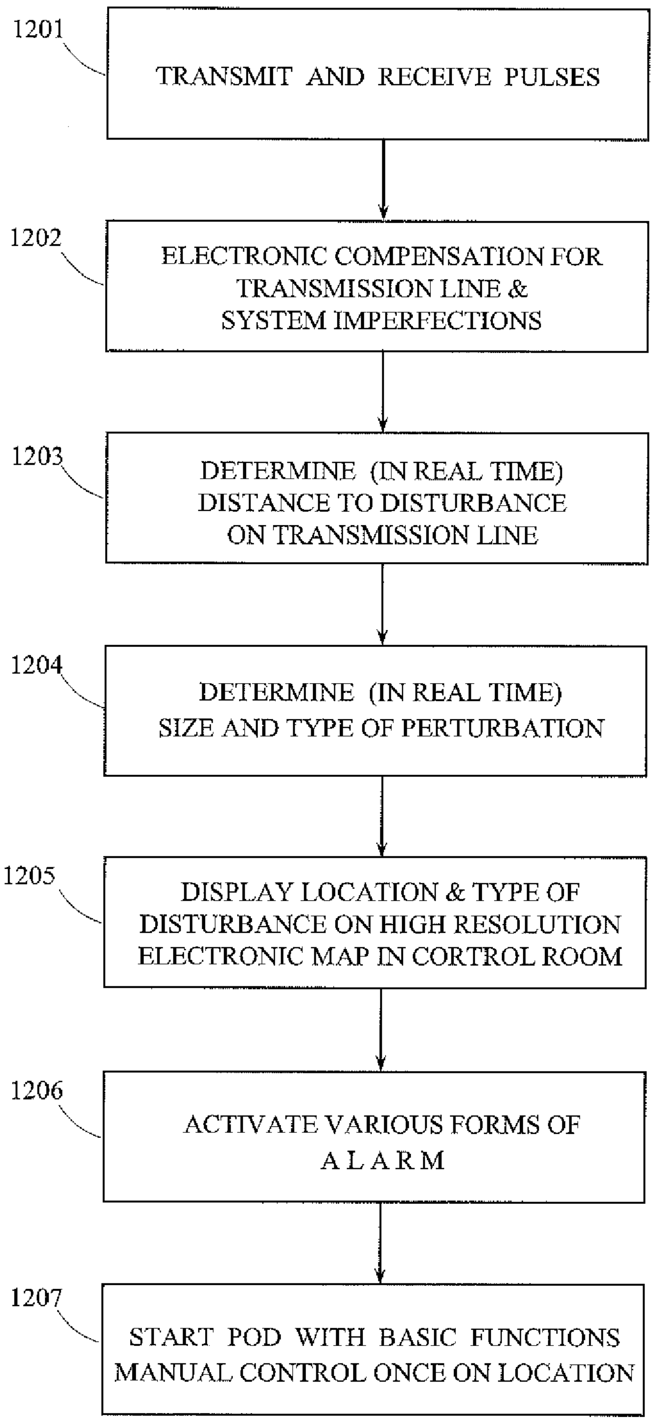
FIG. 12 is a flow chart showing an overview of the operation of the electromagnetic fence system, according to an example of an embodiment.

FIG. 12 is a flow chart showing an overview of the operation of the electromagnetic fence system, according to an example of an embodiment. An electrical signal comprising of a generally continuous string of high voltage pulses can be transmitted along the transmission line 106, as indicated in block 1201. The received electrical signal can be received from the transmission line 106, as indicated in block 1201. Signal processor and signal analyzer (control system 108) can provide electronic compensation for transmission line and system imperfections, as indicated in block 1202. Disturbances can be detected and the distance to disturbance (intrusion location) along the transmission line can be calculated in real-time, as indicated in block 1203. The size and type of perturbation caused by the intrusion can be determined in real time, as indicated in block 1204. Location and type of disturbance can be displayed in a control room (and at other locations) on high resolution electronic maps, as indicated in block 1205. Alarms and responses can be provided, as indicated in block 1206. A pod 800 can be deployed in response to the detection of a perturbation that is indicative of an intrusion, as indicated in block 1207.

A sequence of pulses can be sent. According to an embodiment, a next electrical signal is not transmitted before the time that it takes for the electrical signal to travel to the far end of the transmission line, e.g., to the load 107, and back to the receiver 103. Thus, sufficient time is provided between transmitted pulses to allow for a reflected signal to be received before the next pulse is transmitted. Thus, the transmitter 101 can comprise a pulse generator 105 and the transmitted signal comprises a continuum of electrical pulses having a repetition rate such that a reflected pulse from a far end of the transmission line is received by the receiver before a next pulse is transmitted by the transmitter.

As an example of the operation of an embodiment, a transmission line is assumed to be ten miles long. At approximately the speed of light, electrical pulses, e.g. transmitted signals, will travel from the transmitter 101 at the near end of the transmission line 106 to the load 107 at the far end of the transmission line 106 in approximately 50 microseconds. If an intrusion occurs proximate the far end of the transmission line 106, then pulse will take approximately 50 microseconds to travel from the transmitter 101 to the site of the intrusion and the reflection, e.g., the received signal, will take approximately another 50 microseconds to travel from the site of the intrusion back to the receiver 103. This is a total round trip time of approximately 100 microseconds. In this example, a pulse repetition rate of up to 10,000 pulses per second can be used while assuring that all reflections created anywhere along the 10 mile long transmission line are received before the next pulse is transmitted. Thus, every point in this example along the 10 mile length of the transmission line 106 can be interrogated up to 10,000 times per second.

The receiver 103 can work in synchronization with the transmitter 101 such that the receiver 103 is substantially disconnected (isolated) from the transmitter 101 during the time periods when each pulse is transmitted. In this manner, damage to the receiver 103 can be avoided and analysis of the return signal can be simplified.

The gain of an amplifier (such as the preamplifier of the receiver 103) can be varied such that the gain of the receiver 103 is turned off for a short period of time while each time a high voltage pulse is being transmitted. The gain of the amplifier can be ramped up in a sawtooth-like fashion (linearly or non-linearly depending on the application) at the pulse repetition rate to provide an improved signal to noise ratio for the received reflected signals. The rate of gain ramp-up within each cycle of the saw-tooth-like gain profile can be adjusted to substantially compensate for transmission line losses.

Varying the gain of the amplifier can facilitate an increased dynamic range of the receiver 103, thus facilitating the use of longer lengths of lossy transmission lines 106. Faster sampling and higher quantization for digitization of reflections can also be provided. For example, 12 bits per sample, 14 bits per sample, or higher digital resolutions can be achieved.

A base line signature of the transmission line 106 can be obtained prior to operation for intrusion detection. In the case of a 10 mile long line, as an example this return signal signature is 100 microseconds long. In case, if the reflected signal is sampled, digitized and stored at every nanosecond, this results in 100,000 data points. In order to reduce the noise effects to below the least significant bit (LSB) the average of many signatures (thousand signatures, for example) are taken and then stored. Such an averaging can also be used to determine and store a baseline signature of a specific transmission line 106, after the transmission line segment was installed.

Using the above example of a 10 mile long transmission line, during intrusion detection operation, the stored baseline signature is subtracted from each 100 microsecond long signature and the resulting digital difference signature can be used. A selection of signal processing methods are available and can be used to improve the sensitivity, to improve the signal resolution, or to reduce the noise associated with the reflected signal. For example, digital filtering can be used to increase the signal-to-noise ratio. Five, ten (or more) digital difference signatures can be averaged. These average difference digital signatures can be scanned spatially a desired number of times per second.

At the control center, which may be receiving border monitor data in real time from up to several tens of control stations 100, a plurality of large high resolution displays 111 can show strips of map segments of the border to be protected. Each map segment can correspond to an area along one segment of a transmission line 106 supported by one transmitter and one receiver. A satellite map, showing the same border segment with similar spatial resolution for example may be superimposed. For example, each map segment can represent a 1 to 10 mile segment of a border. A solid line can show the location or path of the transmission line 106. For example, a 10 mile border segment could be represented by 10,000 pixels and each adjacent pixel pair can represent two points along the border with 5 foot distance in between them.

An intrusion can be indicated as deviation of the digital difference signature from zero. A deviation of the digital difference signature (DDS) from zero can be automatically detected and displayed in a variety of different ways on the map of a display 111. For example, a flashing circle or a flashing dot can be used to indicate the location of an intrusion. A diameter, intensity, flashing rate or color of the circle or dot can indicate the strength of the DDS signal and thus the size of the intruding object, person or number of persons. The detection of an intrusion can result in a pod 800 being sent along the transmission line 106 automatically to investigate the intrusion. After an intrusion has been sensed and while the pod 800 travels toward the intrusion point, the instant location of the pod 800 and the progress of the its travel can be indicated on the display 111 in real time.

Characteristics of the transmission line 106, especially various line losses and line dispersion can be used in determining the maximum line length that can be serviced by a transmitter/receiver system. The transmission line 106 can be of sufficiently high quality to allow operation over long line-lengths. Depending on the particular application, with a given border-length, such as 5 miles, as an example, the technical approach may favor use of a single run of top quality transmission line, or, perhaps five shorter length runs using lesser quality lines or when the electromagnetic fence has to be installed in a rough terrain environment, consisting of rocky ledges, boulders or steep hill sides in a canyon country where shorter line lengths are necessary. A given line-length (between two control stations) can be broken up into several shorter sections in some cases, such as in areas where illegal border crossings are frequent, and may occur at numerous locations simultaneously.

A transmission line 106 is considered high quality when its characteristics are maintained as constant as possible over its full length. According to an embodiment, the characteristic impedance of the transmission line 106 is made to be as constant as possible. According to an embodiment, losses by the transmission line 106 are reduced substantially to a minimum so as to achieve high quality performance. In addition to ohmic losses in the conductors of the transmission line 106, losses occur in the conductor support structures, even if they are made of top quality low loss dielectrics. Bushes and trees that grow up around the transmission line 106 also create line losses. Periodic line maintenance can help to keep these losses at a minimum, especially in the case of long line segment runs, Line dispersion can become an issue. As a result of line dispersion, pulse shapes are deformed, pulse rise (and fall) times become longer in proportion to the length of travel of the pulses. If the dispersion is strong enough, or the transmission line 106 is long enough, dispersion will destroy the shape of the pulses and the accuracy of intrusion locating. Some of this effect can be compensated in software if the dispersion value is known. Alternately, by using compensating nonlinear elements distributed along the transmission line 106, a Soliton-like pulse transmission can be achieved, wherein the pulse shape is maintained over long line lengths.

Figure 13A:
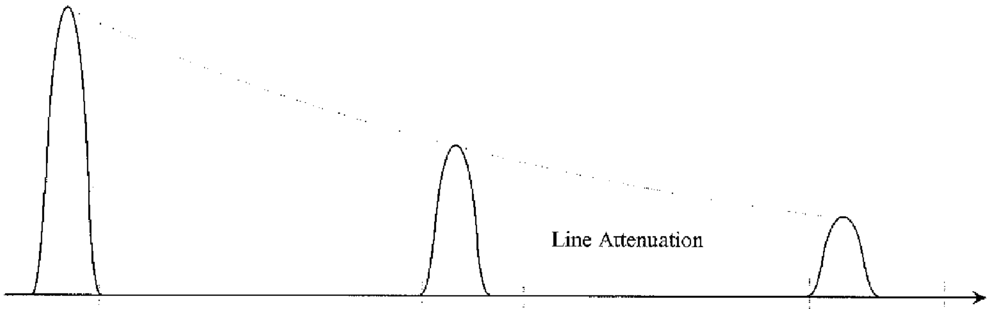
FIGS. 13A-13C show typical changes of a pulse shape along a transmission line due to losses and line dispersion.
Figure 13B:
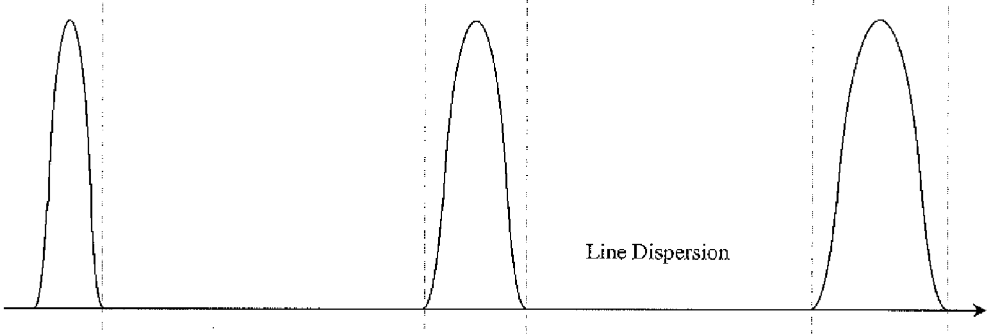
Figure 13C:
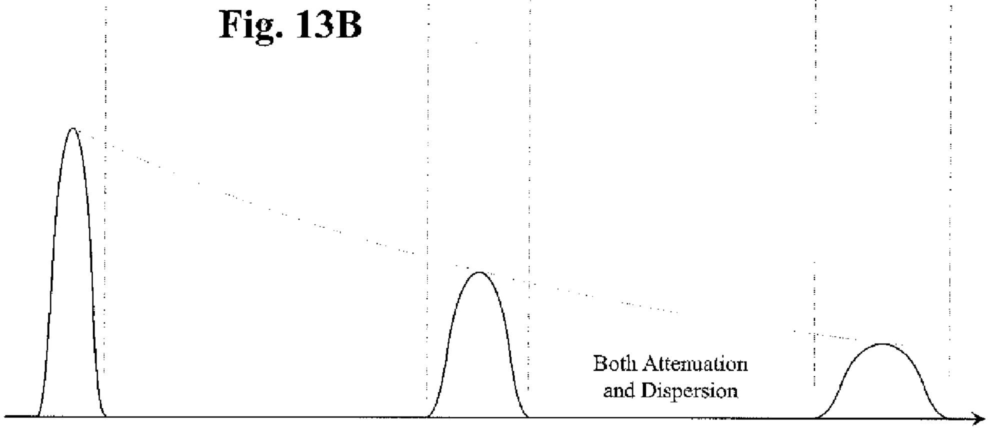

FIGS. 13A-13C illustrate three cases of a transmission line's effects on shape of a pulse as it travels along the line. FIG. 13A shows schematically a pulse shape change due to line losses (conductive losses, dielectric losses in the support structures, scattering due to line characteristic impedance variations and losses caused by environmental perturbations such as bushes and trees in the vicinity, condensation, rain, snow, etc. on support structures in contact with the conductors). The use of a receiver 103 having a periodically ramped amplifier gain can compensate, as least to some degree, for such undesirable effects.

FIG. 13B shows the effect of only line dispersion present on a pulse propagating on a line. Various methods (such as nonlinear amplification) may be used to properly sharpen the received distorted pulses. For example, the pulse sharpening process can be ramped.

FIG. 13C illustrates a pulse shape change due to effects of both line losses and dispersion. In this case ramping of the gain and pulse sharpening can both be used for compensation.

FIG. 14 illustrates four different configurations where the pod rail is made into a structure separate from the multi-conductor sensor transmission line 106. In all four illustrations the intrusion is shown as an arrow on the left side 1400, the primary transmission line 106 in these examples consists of three conductors located next to the arrow 106 (the support structures for the transmission line 106 are not shown). All four illustrations in FIG. 14 also show the cross-section of an instrument pod 800, with the cross-section of a monorail 1401 going through the center of the pod for example. Support structures 1402 support the monorail 1401. Three out of the four examples also show a second transmission line 1406 on the other side of the monorail 1401 for those applications where the monorail and pod must be protected on both sides from attacks. The support 1402 can be formed upon the ground as 201 or upon any desired structure.

Figures 14A, 14B, 14C, 14D:
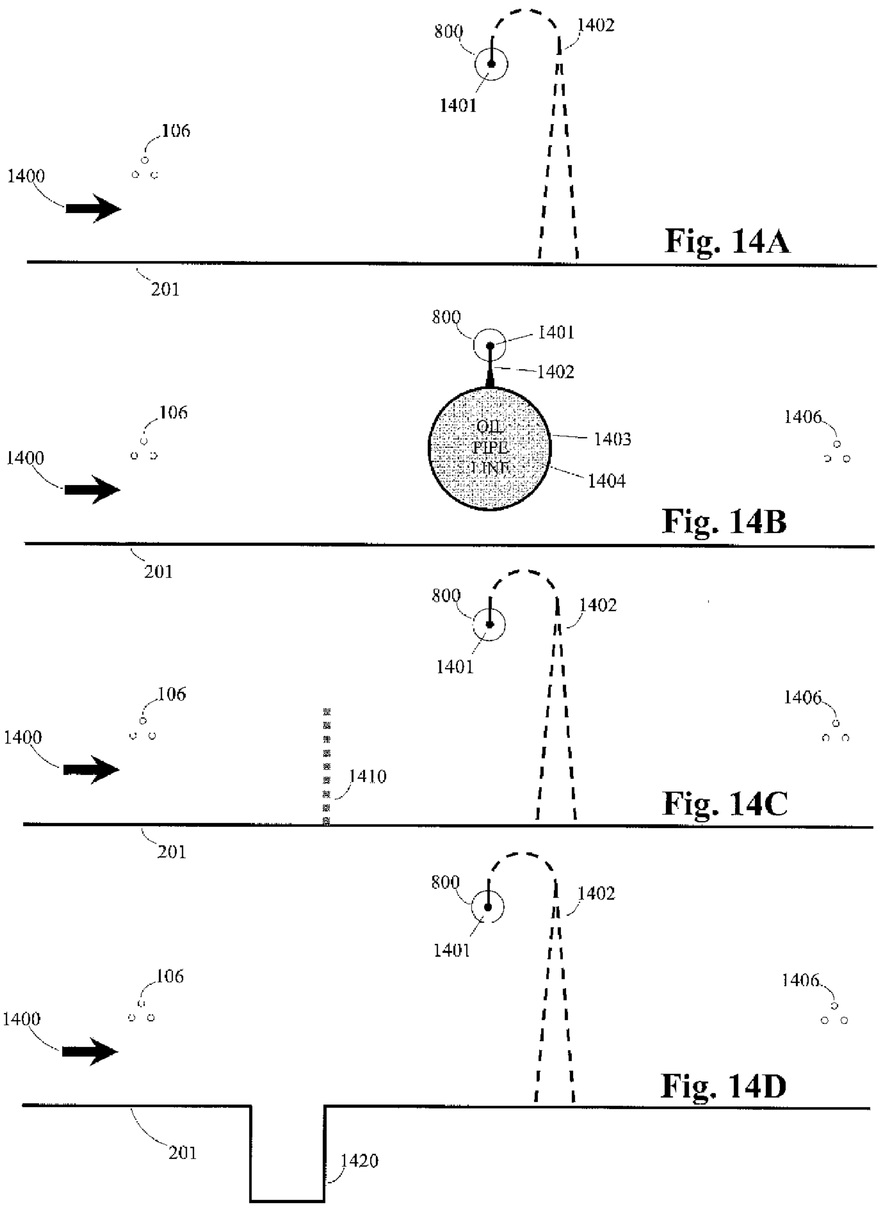
FIGS. 14A-14D are examples of embodiments wherein the rails of a pod system are separated from the transmission line.

FIG. 14A shows an application where trespassers can only be expected to approach from one direction. This is clearly the case when perimeter protection is needed. The distance between the transmission line 106 and monorail 1401 can depend on how much time it takes for the pod 800 to arrive to the point where the intrusion takes place.

FIG. 14B shows a typical configuration for protecting something such as a pipe line 1403, for example. Generally, the pipe line can be protected from intrusion on both sides thereof. Thus, substantially identical sets of transmission lines 106 and 1406 can be provided on both sides of the pipeline 1403. In this example, monorail 1401 is mounted on top of the pipe-line 1403 with a monorail support structure 1402. The pipe line 1403 can carry any desired material, oil, gas, mineral-slurry, 1404 etc. In some applications a dual rail line (instead of the monorail 1401) can be better suited for the purpose.

FIG. 14C shows a configuration, in which a wall or fence 1410 is installed to slow down intruders' progress and keep them in the field of view of pod-cameras longer. This illustration shows a two-sided protection for the pod and its monorail system, to prevent the possibility of sabotage from within the boundary.

FIG. 14D is similar to Figure C, except that a trench 1420 is used in place of the fence 1410 to slow down the intruders' progress. In some cases, such as when the ground 201 is rocky (which makes it hard to dig a trench), installation of the fence 1410 may be preferred.

The terms "near end" and "far end" can be assigned arbitrarily. The near end and the far end can be at opposite ends of a transmission line. The near end can be proximate a manned monitoring control station 100, for example. Both the near end and the far end can be remotely located with respect to any manned facility. For example, the transmission line can take the shape of a closed loop, where the near and far ends are both at the same location, such as in the case of enclosing a given area with a perimeter fence or border.

As used herein, the term "border" can be defined to include any desired border, boundary, or other means for defining an area or separation of areas.

For example, various embodiments can be used to mitigate theft from precious metal, e.g., gold or silver, mines. Various embodiments can be used to detect the unauthorized movement of such metals across a boundary, such as past a fence that surrounds the mine.

For example, various embodiments can be used to detect and/or mitigate intrusion at sensitive facilities such as airports, power plants, and nuclear installations. Thus, terrorist activities at such facilities can be prevented.

All of the conductors of a transmission line 106 can be hard-gold plated to eliminate corrosion, oxidation and minimize undesirable line loses. All of the supports 901 or insulator frames 701 for the transmission line conductors 106 can be formed of high quality, extra low-loss materials to mitigate undesirable leakage from the transmission line.

A single transmission line 106 can be several miles long (from the near end to the far end). For example, a single transmission line 106 can be 10 miles long. A series of contiguous transmission lines 106 can be used to monitor extensive borders or facilities. A single control center can facilitate the operation of a plurality of separate electromagnetic fences, by supervising a plurality of control stations 100.

A resolution of better than one meter can be achieved. That is, the location of an intrusion along the transmission line 106 can be determined to within one meter or better. Maximum pulse-rate is determined by the end-to-end roundtrip travel-time. In other words, pulses can be transmitted at rates as high as 10,000 pulses per second in the case of a 10 mile long transmission line, or up to 100,000 pulses per second in the case of a 1 mile long line. In many applications, such high pulse rates are not needed, in fact not even desired. Lower pulse rates (1 to 10 pulses/sec) result in a less expensive installation, less power used by the installation, less physical danger to individuals (intruders).

Although an intruder can short circuit or cut the transmission line 106, such action will not prevent the intrusion from being detected. Short circuiting or cutting the transmission line 106 will result in a perturbation that will clearly indicate that an intrusion is in progress.

One or more embodiments can provide a surveillance system that is inexpensive to install, operate and maintain and also that reliably detects intrusions even in adverse weather conditions such as rain, snow, and hail. The described fence system is highly sabotage-proof, destruction-proof.

The transmission line can comprise a conductor such as copper. The conductor can be coated to protect it from corrosion, oxidation by materials, such as gold. The transmission line conductors can be made of high temperature superconducting materials producing a superconductor transmission line. While such a structure can be more expensive and technologically more complicated to design and build, this approach can have particularly significant advantages when the transmission line has to extend for long distances. For example, the transmission line can comprise liquid nitrogen cooled high temperature superconductors.

The transmission line can utilize Soliton-like pulse-propagation, wherein degradation of the signal is inhibited according to known techniques. For example, the transmission line can utilize non-linear elements to compensate for the pulse shape destroying effects of dispersion.

As used herein, the term "border violation" can include a border intrusion, an attempted border intrusion, or merely approaching a boarder. A border violation can be done by a person, an animal, and/or a object.

According to an embodiment, the transmission line can be divided into comparatively longer segments where fewer border violations are expected and the transmission line is divided into comparatively shorter segments where more border violations are expected. In this manner, quicker response to a border violation can be provided, such as by reducing the response time of the pod.

The pod can travel along the transmission line. The pod can use the transmission line conductors as rails. Alternatively, the pod can have separate rails or other guiding hardware. The pod can travel at high speeds to reach the point of intrusion and be used as response and challenge to the detected threat.

The transmission line can comprises a plurality of segments thereof. The use of such segments can allow the transmission line to cover any desired length of border or the like. That is, the electromagnetic fence may have any desired length since it can be assembled of an arbitrary number of transmission line segments, each having its own control station.

Thus, one or more embodiments use time domain reflectometry to remotely detect and/or locate border violations. Various examples of such embodiments, including their construction and use, are described herein. According to various one of such embodiments, a border violation can be detected and a challenge can be issued to the intruder.

Embodiments described above illustrate, but do not limit, the invention. It should also be understood that numerous modifications and variations are possible in accordance with the principles of the present invention. Accordingly, the scope of the invention is defined by the following claims.

The invention claimed is:

1. A system comprising:
- a transmission line configured to use time domain reflectometry to remotely detect a border violation and;
- a control system configured to facilitate determination of a location of the border violation and configured to facilitate determination of a size of an intruder.

2. The system as recited in claim 1, wherein the control system is configured to determine a direction of travel of the intruder across the transmission line.

3. The system as recited in claim 1, wherein the transmission line has a substantially constant characteristic impedance.

4. The system as recited in claim 1, wherein the control system is configured to at least partially compensate for discontinuities in the transmission line that affect the characteristic impedance thereof.

5. The system as recited in claim 1, wherein the control system is configured to at least partially compensate for transmission line imperfections.

6. The system as recited in claim 5, wherein the control system is configured to at least partially compensate for transmission line imperfections by digitizing and storing information representative of the imperfections and by subtracting the information representative of the imperfections from information representative of a return signal to define a difference signal.

7. The system as recited in claim 6, wherein the difference signal is approximately zero when no border violation is occurring.

8. The system as recited in claim 1, wherein the transmission line comprises conductors and the conductors comprise cryogenically cooled high temperature superconductors.

9. The system as recited in claim 1, wherein the transmission line is configured to utilize Soliton-like pulse-propagation.

10. The system as recited in claim 1, wherein the transmission line utilizes non-linear elements to at least partially compensate for dispersion.

11. The system as recited in claim 1, wherein:
- the transmission line at least partially defines an electronic fence;
- the electronic fence comprises a plurality of transmission line segments; and
- each transmission line segment has a dedicated control system.

12. The system as recited in claim 1, wherein the transmission line is divided into comparatively longer segments where fewer border violations are expected and the transmission line is divided into comparatively shorter segments where more border violations are expected.

13. The system as recited in claim 1, further comprising a pod configured to travel along the transmission line.

14. The system as recited in claim 13, wherein the pod is configured to travel upon the transmission line.

15. The system as recited in claim 13, wherein the pod is configured to respond to the border violation.

16. The system as recited in claim 13, wherein the pod is configured to challenge an intruder.

17. A method comprising using time domain reflectometry to remotely detect a border violation using the system of claim 1.

18. A system comprising:
- a transmission line configured to use time domain reflectometry to remotely detect a border violation;
- a control system configured to facilitate determination of a location of the border violation; and
- wherein the control system is configured to at least partially compensate for transmission line imperfections by digitizing and storing information representative of the imperfections and by subtracting the information representative of the imperfections from information representative of a return signal to define a difference signal.

19. The system as recited in claim 18, wherein the difference signal is approximately zero when no border violation is occurring.

20. A system comprising:

a transmission line configured to use time domain reflectometry to remotely detect a border violation; and wherein the transmission line is configured to utilize Soliton-like pulse-propagation.

21. A system comprising:

a transmission line configured to use time domain reflectometry to remotely detect a border violation; and wherein the transmission line is divided into comparatively longer segments where fewer border violations are expected and the transmission line is divided into comparatively shorter segments where more border violations are expected.

22. A system comprising:

a transmission line configured to use time domain reflectometry to remotely detect a border violation; and a pod configured to travel along the transmission line.

23. The system as recited in claim 22, wherein the pod is configured to travel upon the transmission line.

24. The system as recited in claim 22, wherein the pod is configured to respond to the border violation.

25. The system as recited in claim 22, wherein the pod is configured to challenge an intruder.

* * * * *